(12) United States Patent
Ishibashi et al.

(10) Patent No.: US 11,214,481 B2
(45) Date of Patent: Jan. 4, 2022

(54) MEMS ELEMENT

(71) Applicant: KABUSHIKI KAISHA TOSHIBA, Tokyo (JP)

(72) Inventors: Fumitaka Ishibashi, Kawasaki Kanagawa (JP); Naofumi Nakamura, Setagaya Tokyo (JP); Hiroaki Yamazaki, Yokohama Kanagawa (JP); Tomohiro Saito, Yokohama Kanagawa (JP); Tomohiko Nagata, Yokohama Kanagawa (JP); Kei Masunishi, Kawasaki Kanagawa (JP); Yoshihiko Kurui, Chigasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/808,499

(22) Filed: Mar. 4, 2020

(65) Prior Publication Data

US 2021/0047171 A1 Feb. 18, 2021

(30) Foreign Application Priority Data

Aug. 13, 2019 (JP) .............................. JP2019-148370

(51) Int. Cl.
*B81B 3/00* (2006.01)
(52) U.S. Cl.
CPC ............ *B81B 3/001* (2013.01); *B81B 3/0008* (2013.01); *B81B 3/0056* (2013.01); *B81B 2203/04* (2013.01)

(58) Field of Classification Search
CPC ................ B81B 3/001; B81B 2203/04; B81B 2203/019; B81B 3/0008; B81B 3/0056; B81C 1/00626
See application file for complete search history.

(56) References Cited

U.S. PATENT DOCUMENTS

| 5,677,965 | A | * | 10/1997 | Moret | .................. H04R 19/005 381/113 |
| 10,384,930 | B2 | * | 8/2019 | Lee | ......................... B81B 3/0008 |
| 2015/0068314 | A1 | | 3/2015 | Nakamura et al. | |
| 2016/0293336 | A1 | | 10/2016 | Fujimoto et al. | |
| 2019/0062153 | A1 | * | 2/2019 | Tseng | ........................ B81B 7/02 |

FOREIGN PATENT DOCUMENTS

JP 2015-52532 A 3/2015
JP 2016-197060 A 11/2016

* cited by examiner

*Primary Examiner* — Yasser A Abdelaziez
(74) *Attorney, Agent, or Firm* — Finnegan, Henderson, Farabow, Garrett & Dunner L.L.P.

(57) ABSTRACT

According to one embodiment, a MEMS element includes a base body, a supporter, a film part, a first electrode, a second electrode, and an insulating member. The supporter is fixed to the base body. The film part is separated from the base body in a first direction and supported by the supporter. The first electrode is fixed to the base body and provided between the base body and the film part. The second electrode is fixed to the film part and provided between the first electrode and the film part. The insulating member includes a first insulating region and a second insulating region. The first insulating region is provided between the first electrode and the second electrode. A first gap is provided between the first insulating region and the second electrode. The second insulating region does not overlap the first electrode in the first direction.

20 Claims, 8 Drawing Sheets

MEMS ELEMENT

CROSS-REFERENCE TO RELATED APPLICATIONS

This application is based upon and claims the benefit of priority from Japanese Patent Application No. 2019-148370, filed on Aug. 13, 2019; the entire contents of which are incorporated herein by reference.

FIELD

Embodiments described herein relate generally to a MEMS sensor.

BACKGROUND

For example, there is a MEMS element utilizing a MEMS structure. Stable characteristics of the MEMS element are desirable.

DETAILED DESCRIPTION

Figure 1A:
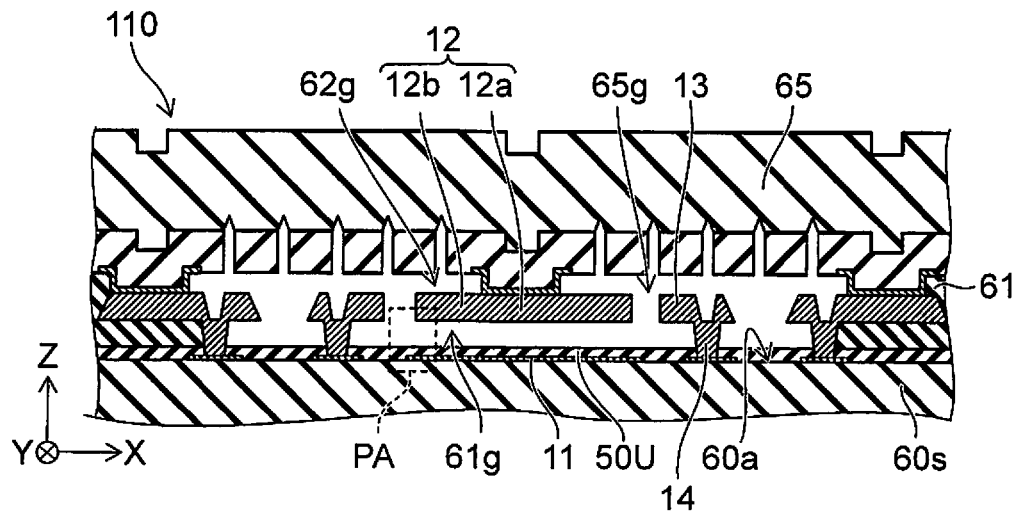
FIG. 1A and FIG. 1B are schematic cross-sectional views illustrating a MEMS element according to a first embodiment.

According to one embodiment, a MEMS element includes a base body, a supporter, a film part, a first electrode, a second electrode, and an insulating member. The supporter is fixed to the base body. The film part is separated from the base body in a first direction and supported by the supporter. The first electrode is fixed to the base body and provided between the base body and the film part. The second electrode is fixed to the film part and provided between the first electrode and the film part. The insulating member includes a first insulating region and a second insulating region. The first insulating region is provided between the first electrode and the second electrode. A first gap is provided between the first insulating region and the second electrode. The second insulating region does not overlap the first electrode in the first direction. A first thickness along the first direction of the first insulating region is thinner than a second thickness along the first direction of the second insulating region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
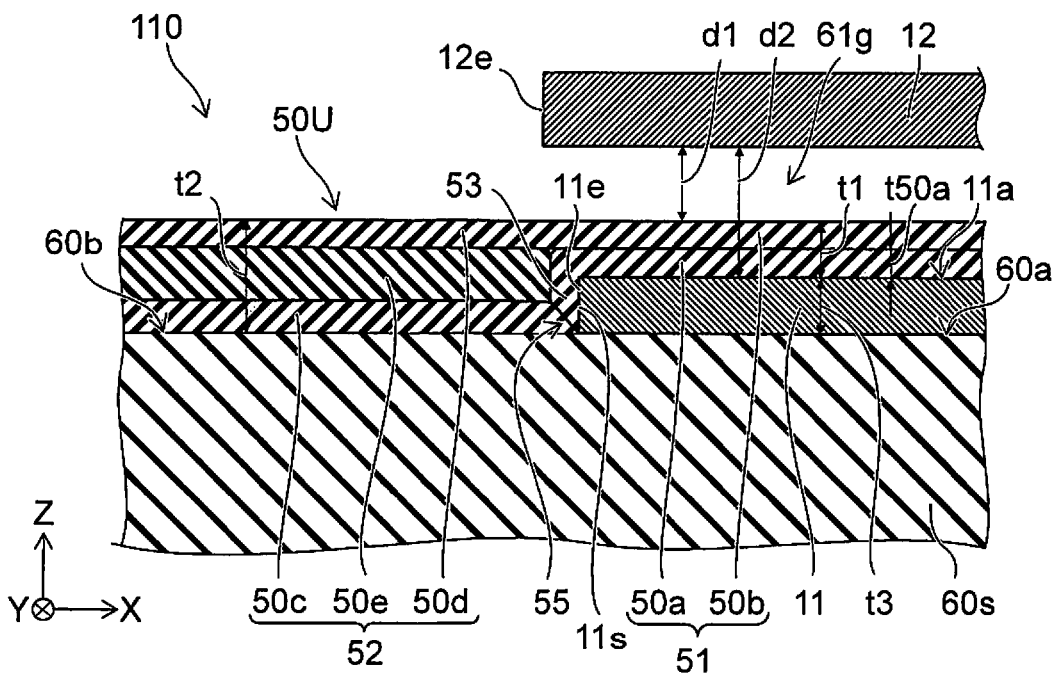

FIG. 1A and FIG. 1B are schematic cross-sectional views illustrating a MEMS element according to a first embodiment.

FIG. 1B is an enlarged view of a portion PA of FIG. 1A.

Figure 2:
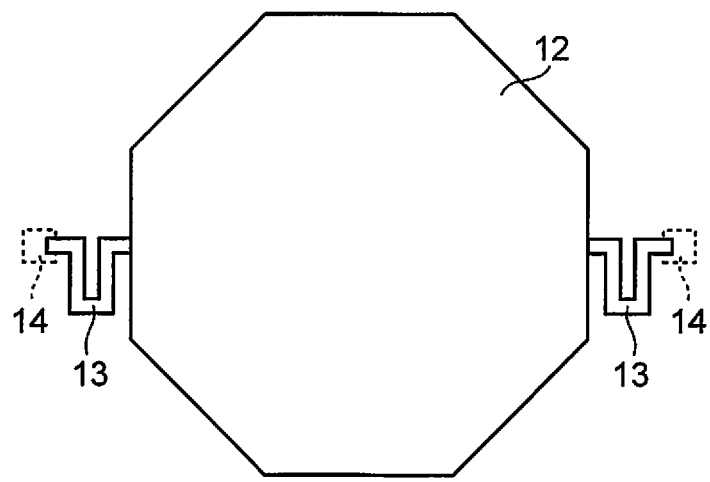
FIG. 2 is a schematic plan view illustrating a portion of the MEMS element according to the first embodiment.

FIG. 2 is a schematic plan view illustrating a portion of the MEMS element according to the first embodiment.

As shown in FIG. 1A, the MEMS element 110 according to the embodiment includes a base body 60s, a supporter 61, a film part 65, a first electrode 11, and a second electrode 12.

The base body 60s includes, for example, a substrate, etc. The base body 60s is, for example, insulative. The base body 60s includes, for example, silicon oxide. The base body 60s includes, for example, a silicon oxide layer provided on a silicon substrate, etc. The material of the base body 60s is arbitrary.

The supporter 61 is fixed to the base body 60s. The supporter 61 is insulative. The supporter 61 is, for example, a silicon oxide layer. The material of the supporter 61 is arbitrary. The film part 65 is supported by the supporter 61. The film part 65 is separated from the base body 60s in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

For example, the base body 60s spreads along the X-Y plane. The film part 65 spreads along the X-Y plane.

A gap 65g is provided between the base body 60s and the film part 65.

The first electrode 11 is provided between the base body 60s and the film part 65. The first electrode 11 is fixed to the base body 60s. The first electrode 11 is a fixed electrode.

The second electrode 12 is provided between the first electrode 11 and the film part 65. The second electrode 12 is fixed to the film part 65. The second electrode 12 is separated from the first electrode 11 in the first direction.

As shown in FIG. 2, the second electrode 12 is electrically connected to a connection part 13. As shown in FIG. 2 and FIG. 1A, the connection part 13 is electrically connected to a second electrode conductive part 14 provided at the base body 60s.

For example, an electrical characteristic between the first electrode 11 and the second electrode conductive part 14 can be detected. An electrical characteristic (e.g., the electrostatic capacitance) between the first electrode 11 and the second electrode 12 can be detected thereby.

For example, the film part 65 deforms when a force (e.g., pressure) from the outside is applied to the film part 65. The position in the Z-axis direction of the second electrode 12 is displaced thereby. For example, a distance d2 between the first electrode 11 and the second electrode 12 changes according to the deformation of the film part 65. The electrostatic capacitance between the first electrode 11 and the second electrode 12 changes according to the deformation of the film part 65. For example, the force (e.g., the pressure) from the outside, etc., can be detected by detecting a characteristic corresponding to the electrostatic capacitance between the first electrode 11 and the second electrode 12. For example, the MEMS element 110 can be used as the MEMS-type pressure MEMS element.

As shown in FIG. 1B, an insulating member 50U includes a first insulating region 51 and a second insulating region 52. The first insulating region 51 is provided between the first electrode 11 and the second electrode 12. A first gap 61g is provided between the first insulating region 51 and the second electrode 12. The second insulating region 52 does not overlap the first electrode 11 in the first direction (the Z-axis direction).

The base body 60s has a first surface 60a and a second surface 60b. For example, the direction from the second surface 60b toward the first surface 60a crosses the Z-axis direction. For example, the first electrode 11 is provided between the first insulating region 51 and the first surface 60a of the base body 60s. For example, the first electrode 11 is provided on the first surface 60a; and the first insulating region 51 is provided on the first electrode 11. The second insulating region 52 is provided on the second surface 60b.

In the embodiment, a first thickness t1 along the first direction (the Z-axis direction) of the first insulating region 51 is thinner than a second thickness t2 along the first direction of the second insulating region 52. The level difference due to the first electrode 11 is relaxed thereby. For example, the surface of the insulating member 50U is planarized. For example, the configuration of the second electrode 12 is stabilized by forming the second electrode 12 on the insulating member 50U having a flat front. For example, a distance d1 between the insulating member 50U and the second electrode 12 is uniform.

For example, if the configuration of the second electrode 12 is not stabilized, a portion occurs where the distance d1 between the second electrode 12 and the insulating member 50U is excessively short. In such a case, a phenomenon occurs easily in which the second electrode 12 contacts the insulating member 50U. For example, a phenomenon occurs easily in which it is difficult to separate the second electrode 12 from the insulating member 50U. There are cases where the desired detection operation is difficult to perform. Stable characteristics are difficult to obtain.

In the embodiment, the first thickness t1 is thinner than the second thickness t2. For example, the surface of the insulating member 50U is planarized. The configuration of the second electrode 12 is stabilized; for example, the distance d1 between the insulating member 50U and the second electrode 12 is uniform. The phenomenon in which the second electrode 12 contacts or does not separate easily from the insulating member 50U can be suppressed thereby. The desired detection operation is obtained. According to the embodiment, a MEMS element that has stable characteristics can be provided.

In the example, the second electrode 12 includes a first portion 12a and a second portion 12b. The first portion 12a is fixed to the film part 65. The second portion 12b is separated from the film part 65. For example, the second portion 12b is continuous with the first portion 12a. For example, a second gap 62g is provided between the second portion 12b and the film part 65 in the first direction (the Z-axis direction). The second portion 12b is provided as necessary. The second portion 12b may be omitted.

For example, by providing such a second portion 12b and by providing the second gap 62g, for example, the change of the capacitance with respect to the displacement of the film part 65 can be large. Thereby, the external force can be detected with high sensitivity. On the other hand, because the surface area of the second electrode 12 is wide, the electrostatic capacitance between the first electrode 11 and the second electrode 12 is large, and high sensitivity is obtained easily. By, providing the second gap 62g, a large electrostatic capacitance is obtained. By providing the second gap 62g, for example, the film part 65 deforms easily.

The second electrode 12 deforms particularly easily when the second gap 62g is provided. Therefore, the effect of the stabilization of the configuration of the second electrode 12 due to setting the first thickness t1 to be thinner than the second thickness t2 is particularly high. By providing the second gap 62g and setting the first thickness t1 to be thinner than the second thickness t2, highly sensitive detection can be more stable.

The thickness of the first electrode 11 along the first direction (the Z-axis direction) is taken as a third thickness t3. For example, the sum of the third thickness t3 and the first thickness t1 is substantially the same as the second thickness t2. For example, the sum of the third thickness t3 and the first thickness t1 is not less than 0.8 times and not more than 1.2 times the second thickness t2. Good flatness of the surface of the insulating member 50U is obtained thereby. For example, the second thickness t2 is thicker than the third thickness t3 of the first electrode 11 along the first direction.

As shown in FIG. 1B, for example, the first insulating region 51 includes a first insulating film 50a and a second insulating film 50b. The first insulating film 50a is between the first electrode 11 and the second insulating film 50b. For example, the second insulating region 52 includes a third insulating film 50c, a fourth insulating film 50d, and a fifth insulating film 50e. The third insulating film 50c is between the base body 60s and the fourth insulating film 50d. The fifth insulating film 50e is between the third insulating film 50c and the fourth insulating film 50d. For example, the fourth insulating film 50d is continuous with the second insulating film 50b.

For example, the insulating member 50U further includes a third insulating region 53. The direction from the third insulating region 53 toward the first electrode 11 is along a second direction. The second direction crosses the first direction. The second direction is, for example, the X-axis direction. For example, the third insulating region 53 opposes a side surface 11s of the first electrode 11.

The first electrode 11 is provided between the first insulating region 51 and the first surface 60a of the base body 60s. The side surface 11s of the first electrode 11 crosses the first surface 60a. The angle between the side surface 11s and the first surface 60a is not less than 60 degrees but less than 90 degrees. The third insulating region 53 is provided at such a side surface 11s.

For example, the first electrode 11 is formed at the first surface 60a of the base body 60s. An insulating film is formed at the second surface 60b of the base body 60s, an upper surface 11a of the first electrode 11, and the side surface 11s of the first electrode 11. For example, the insulating film is formed by a method such as CVD (chemical vapor deposition), etc. The insulating film that is formed at the second surface 60b is used to form the third insulating film 50c. The insulating film that is formed at the upper surface 11a of the first electrode 11 is used to form the first insulating film 50a. The insulating film that is formed at the side surface 11s of the first electrode 11 is used to form the third insulating region 53. The direction from the third insulating film 50c toward a portion of the third insulating region 53 is along the second direction (e.g., the X-axis direction).

For example, the third insulating region 53 is continuous with the first insulating film 50a. The first insulating film 50a and the third insulating region 53 are seamless. On the other hand, the insulating member 50U includes a boundary 55 between the third insulating region 53 and the third insulating film 50c. The third insulating film 50c is discontinuous with the third insulating region 53. For example, the boundary 55 is formed by the insulating film formed at the second surface 60b and the insulating film formed at the side surface 11s of the first electrode 11 colliding.

For example, the stress of the insulating film is relaxed by the boundary 55 between the third insulating film 50c and the third insulating region 53. For example, there are cases where the first electrode 11 or the insulating member 50U deform due to excessive stress. The stress is relaxed by the boundary 55; and the deformation is suppressed. Good detection characteristics are maintained easily.

For example, the material of the third insulating region 53 is substantially the same as the materials of the first insulating film 50a and the third insulating film 50c. The materials of the first insulating film 50a and the third insulating film 50c are different from the material of the fifth insulating film 50e. The material of the second insulating film 50b is substantially the same as the material of the fourth insulating film 50d. The materials of the second insulating film 50b and the fourth insulating film 50d are different from the material of the fifth insulating film 50e. The etching rates of the second insulating film 50b and the fourth insulating film 50d are different from the etching rate of the sacrificial layer. The second insulating film 50b and the fourth insulating film 50d include, for example, at least one selected from the group consisting of $SiO_x$, Si, and SiN. For example, the materials of the second insulating film 50b and the fourth insulating film 50d may be different from the material of the fifth insulating film 50e. For example, the first insulating film 50a, the third insulating film 50c, and the third insulating region 53 include silicon and nitrogen. For example, the fifth insulating film 50e includes silicon and oxygen. The second insulating film 50b and the fourth insulating film 50d include, for example, at least one selected from the group consisting of a compound and silicon. The compound includes silicon and at least one of nitrogen or oxygen. The second insulating film 50b and the fourth insulating film 50d may include silicon and oxygen.

In the example, a portion of the second electrode 12 does not overlap the first electrode 11 in the first direction (the Z-axis direction). An end portion 12e of the second electrode 12 is positioned outward compared to an end portion 11e of the first electrode 11. The end portion 12e of the second electrode 12 does not overlap the first electrode 11 in the first direction. The second electrode 12 overlaps the end portion 11e of the first electrode 11 in the first direction. In such a case, the end portion 12e of the second electrode 12 is affected easily by the level difference caused by the end portion 11e of the first electrode 11.

Reference examples will now be described.

Figure 3A:
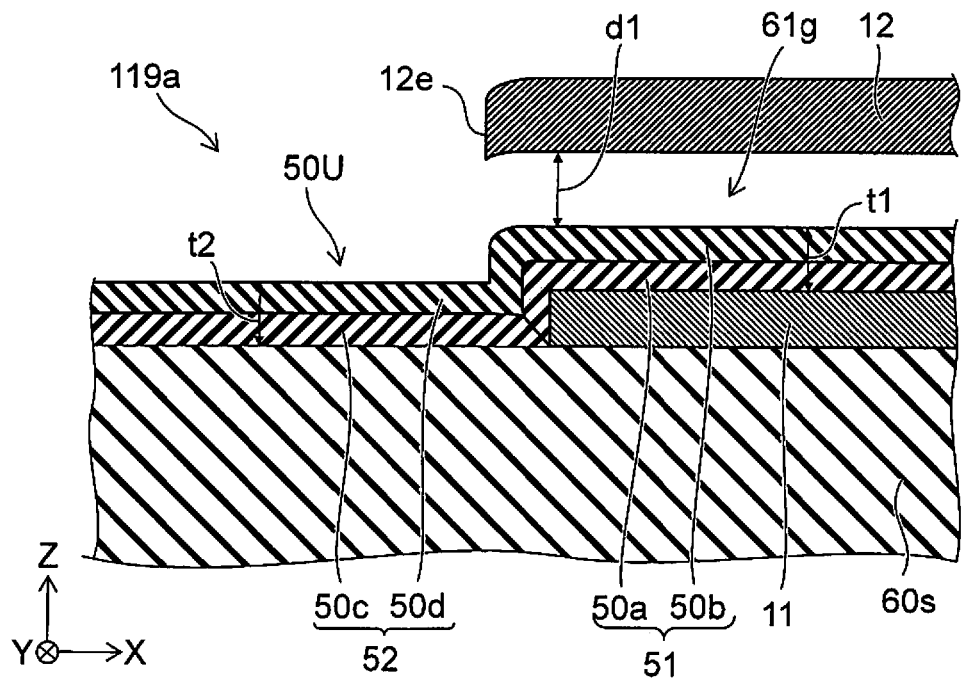
FIG. 3A and FIG. 3B are schematic cross-sectional views illustrating MEMS elements of reference examples.
Figure 3B:
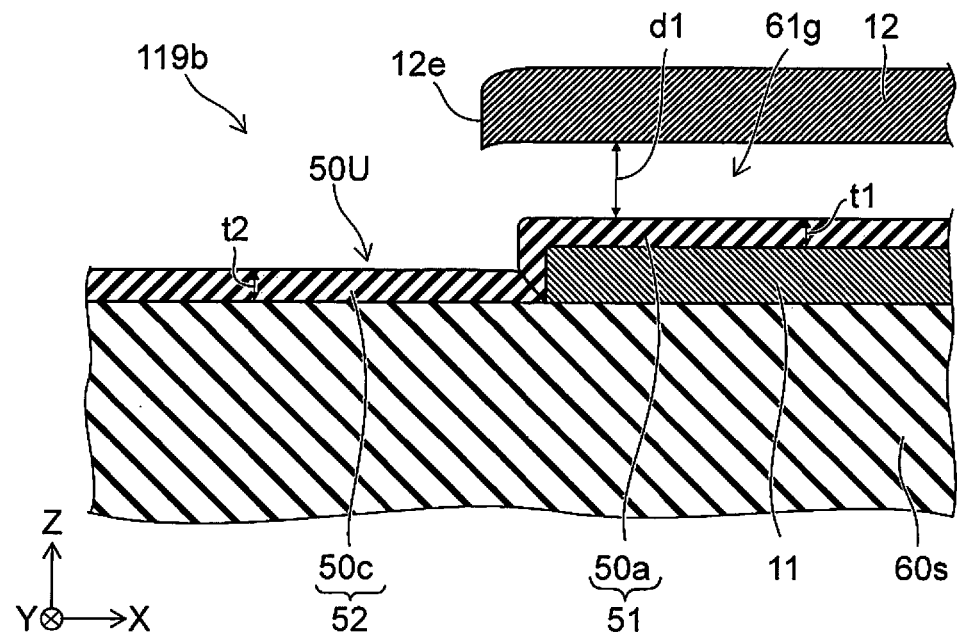

FIG. 3A and FIG. 3B are schematic cross-sectional views illustrating MEMS elements of reference examples.

In a MEMS element 119a shown in FIG. 3A, the second insulating region 52 includes the third insulating film 50c and the fourth insulating film 50d; but the fifth insulating film 50e is not provided. In a MEMS element 119b shown in FIG. 3B, the fifth insulating film 50e, the second insulating film 50b, and the fourth insulating film 50d are not provided. In the MEMS element 119a and the MEMS element 119b, the second thickness t2 is the same as the first thickness t1. The insulating member 50U includes a level difference caused by the first electrode 11. The flatness of the second electrode 12 degrades due to the effects of the level difference. For example, the end portion 12e of the second electrode 12 approaches the insulating member 50U. For example, a phenomenon occurs easily in which the second electrode 12 contacts the insulating member 50U. In these reference examples, for example, a phenomenon occurs easily in which it is difficult to separate the second electrode 12 from the insulating member 50U.

An example of a method for manufacturing the MEMS element 110 will now be described.

Figure 4A:
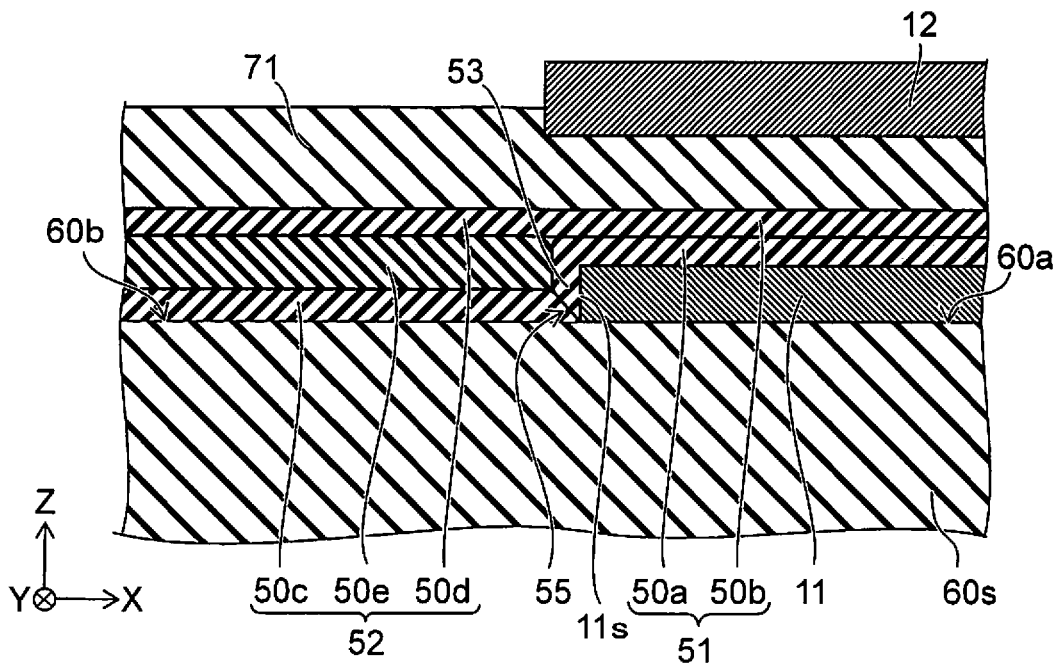
FIG. 4A and FIG. 4B are schematic cross-sectional views illustrating a method for manufacturing the MEMS element according to the first embodiment.
Figure 4B:
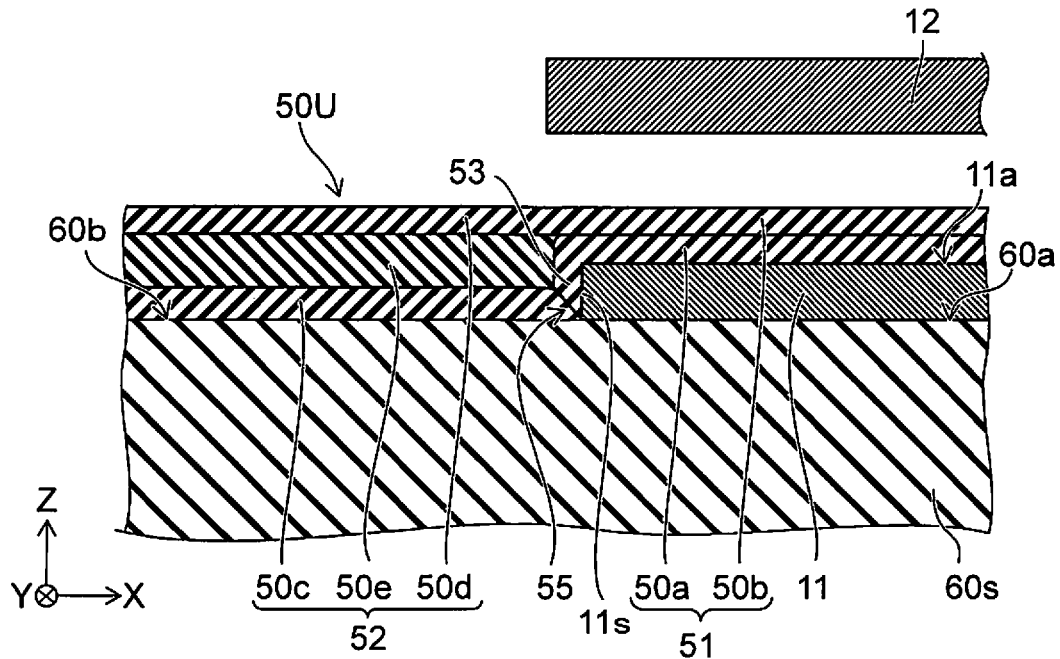

FIG. 4A and FIG. 4B are schematic cross-sectional views illustrating the method for manufacturing the MEMS element according to the first embodiment.

As shown in FIG. 4A, the first electrode 11 is provided on the first surface 60a of the base body 60s. An insulating film is formed on the second surface 60b of the base body 60s, on the upper surface of the first electrode 11, and on the side surface 11s of the first electrode 11. Thereby, the third insulating film 50c, the first insulating film 50a, and the third insulating region 53 are formed. Subsequently, an insulating film that is used to form the fifth insulating film 50e is formed and planarized by a technique such as CMP, etc. For example, the first insulating film 50a functions as a stopper film in the planarization. The fifth insulating film 50e is obtained by the planarization. The fourth insulating film 50d and the second insulating film 50b are obtained by forming an insulating film on the fifth insulating film 50e and the first insulating film 50a.

A sacrificial layer 71 is formed on the fourth insulating film 50d and the second insulating film 50b. The second electrode 12 that has a prescribed configuration is formed on the sacrificial layer 71. Then, the film part 65 (referring to FIG. 1A) is formed.

Subsequently, the sacrificial layer 71 is removed as shown in FIG. 4B. When the sacrificial layer 71 is $SiO_2$, the sacrificial layer 71 can be removed by etching using an etchant including HF, etc. The MEMS element 110 is obtained by such a method.

In the embodiment, the upper surface of the insulating member 50U is flat; therefore, the upper surface of the sacrificial layer 71 also is flat. Therefore, the second electrode 12 also is flat.

An example of a method for manufacturing the MEMS element 119b will now be described as a reference example.

Figure 5A:
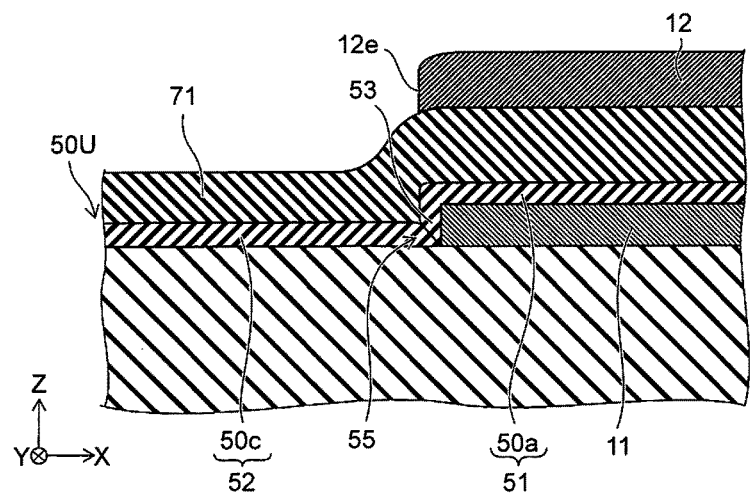
FIG. 5A and FIG. 5B are schematic cross-sectional views illustrating a method for manufacturing the MEMS element of the reference example.
Figure 5B:
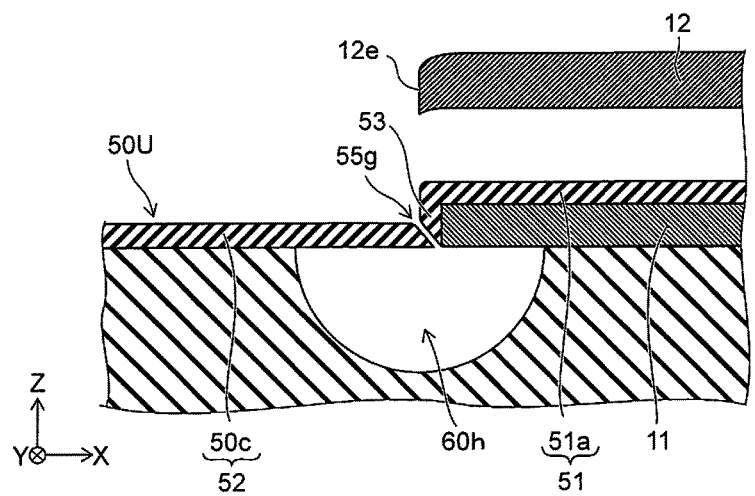

FIG. 5A and FIG. 5B are schematic cross-sectional views illustrating the method for manufacturing the MEMS element of the reference example.

In the case of the MEMS element 119b as shown in FIG. 5A, the first insulating film 50a, the third insulating film 50c, and the third insulating region 53 are provided as the insulating member 50U. The insulating member 50U includes a level difference reflecting the configuration of the first electrode 11. The sacrificial layer 71 is formed on such an insulating member 50U. The sacrificial layer 71 also includes a level difference. The second electrode 12 has a configuration reflecting the level difference of the sacrificial layer 71. The flatness of the second electrode 12 is poor.

The sacrificial layer 71 is removed as shown in FIG. 5B. The distance between the insulating member 50U and the second electrode 12 is locally short at the end portion 12e of the second electrode 12. A phenomenon occurs easily in which the second electrode 12 contacts the insulating member 50U. A phenomenon occurs easily in which it is difficult to separate the second electrode 12 from the insulating member 50U.

Also, in the process of removing the sacrificial layer 71, a gap 55g occurs easily due to the enlargement of the boundary 55 between the third insulating region 53 and the third insulating film 50c. There are also cases where a portion of the base body 60s is removed by the etchant penetrating through the boundary 55 or the gap 55g. There are also cases where a cavity 60h occurs in the base body 60s.

Conversely, in the MEMS element 110 as shown in FIG. 4B, the boundary 55 is covered with and protected by the fifth insulating film 50e, the fourth insulating film 50d, and the second insulating film 50b when removing the sacrificial layer 71.

Therefore, in the MEMS element 110, the penetration of the etchant through the boundary 55 or the gap 55g can be suppressed. The desired MEMS element can be manufactured with high productivity.

In the MEMS element 110 according to the embodiment, for example, a thickness t50a of the first insulating film 50a along the first direction (the Z-axis direction) (referring to FIG. 1B) may be thinner than the third thickness t3 of the first electrode 11 along the first direction. For example, the thickness t50a of the first insulating film 50a may be not more than ¾ of the third thickness t3.

Figure 6A:
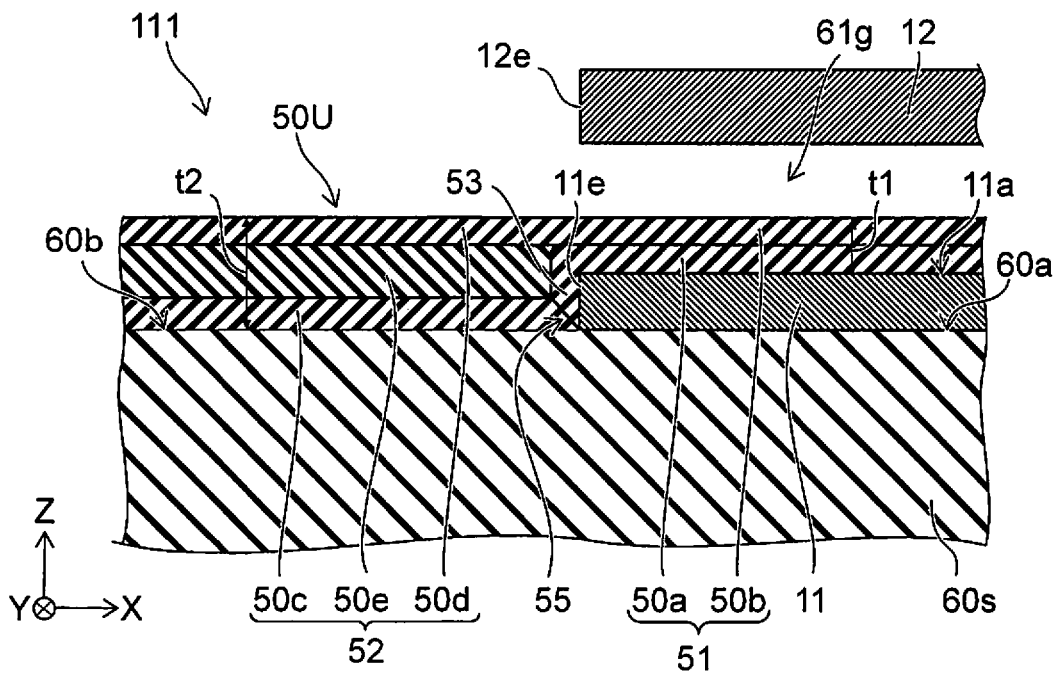
FIG. 6A and FIG. 6B are schematic cross-sectional views illustrating MEMS elements according to the first embodiment.
Figure 6B:
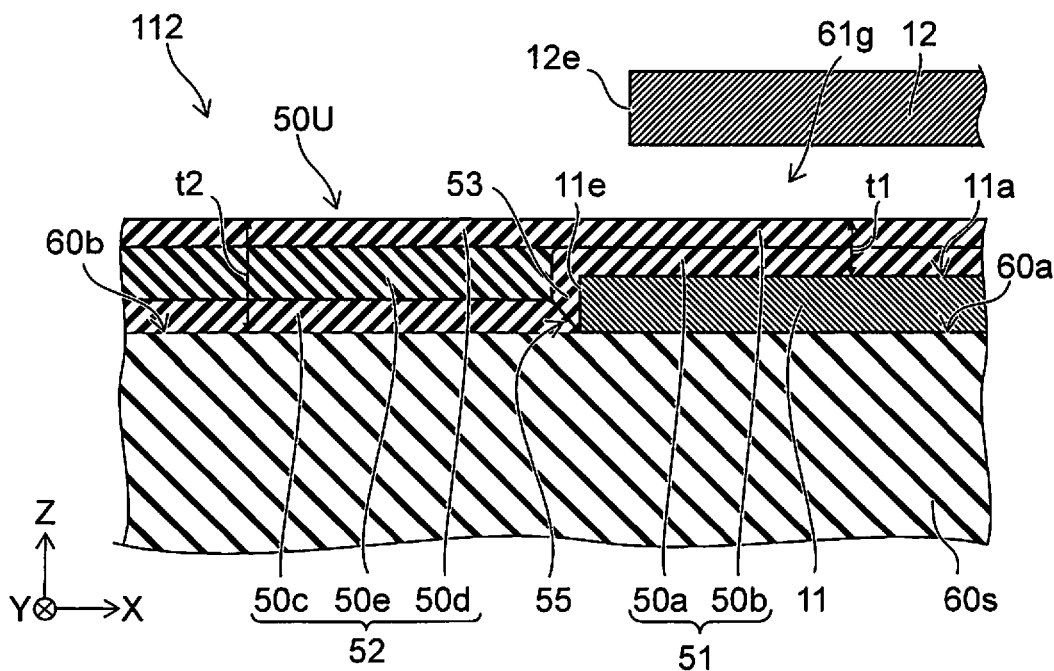

FIG. 6A and FIG. 6B are schematic cross-sectional views illustrating MEMS elements according to the first embodiment.

In a MEMS element 111 shown in FIG. 6A, the position of the end portion 12e of the second electrode 12 substantially matches the position of the end portion 11e of the first electrode 11. In a MEMS element 112 shown in FIG. 6B, the end portion 12e of the second electrode 12 is positioned inward compared to the end portion 11e of the first electrode 11. Thus, a portion of the first electrode 11 may not overlap the second electrode 12 in the first direction (the Z-axis direction). Otherwise, for example, the configurations of the MEMS elements 111 and 112 are similar to the configuration of the MEMS element 110.

Figure 7:
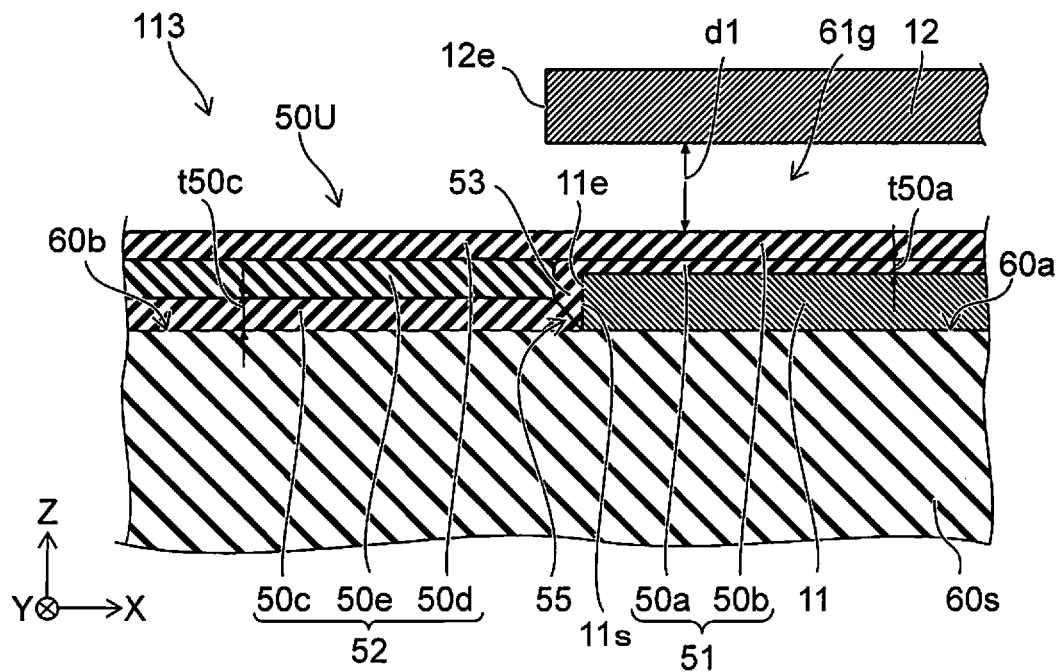
FIG. 7 is a schematic cross-sectional view illustrating a MEMS element according to the first embodiment.

FIG. 7 is a schematic cross-sectional view illustrating a MEMS element according to the first embodiment.

In the MEMS element 113 shown in FIG. 7, the thickness t50a along the first direction (the Z-axis direction) of the first insulating film 50a is thinner than a thickness t50c along the first direction of the third insulating film 50c. For example, a portion of the first insulating film 50a may be removed in the planarization after forming the fifth insulating film 50e. Otherwise, for example, the configuration of the MEMS element 113 is similar to the configuration of the MEMS element 110.

The first thickness t1 is thinner than the second thickness t2 in the MEMS elements 111 to 113 as well. For example, good flatness of the second electrode 12 is obtained. For example, a phenomenon in which the second electrode 12 contacts or does not separate easily from the insulating member 50U can be suppressed. In the MEMS elements 111 to 113 as well, the insulating member 50U includes the boundary 55. For example, the stress is relaxed. The penetration of the etchant can be suppressed because the boundary 55 is protected by the fifth insulating film 50e, the fourth insulating film 50d, and the second insulating film 50b.

Second Embodiment

Figure 8:
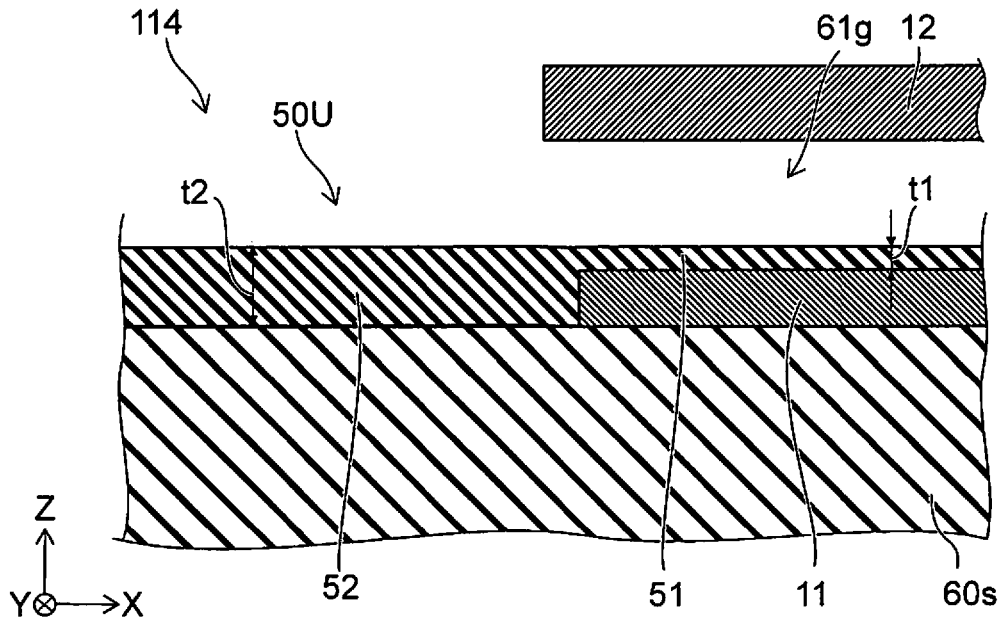
FIG. 8 is a schematic cross-sectional view illustrating a MEMS element according to a second embodiment.

FIG. 8 is a schematic cross-sectional view illustrating a MEMS element according to a second embodiment.

As shown in FIG. 8, the MEMS element 114 according to the embodiment also includes the base body 60s, the supporter 61, the film part 65, the first electrode 11, the second electrode 12, and the insulating member 50U. In the example, the insulating member 50U is one continuous film. Otherwise, the configuration described in reference to the MEMS element 110 is applicable to the configuration of the MEMS element 114. In the MEMS element 114 as well, the first thickness t1 along the first direction (the Z-axis direction) of the first insulating region 51 is thinner than the second thickness t2 along the first direction of the second insulating region 52. In the MEMS element 114 as well, for example, the deformation of the second electrode 12 can be suppressed. In the second embodiment as well, a MEMS element that has stable characteristics can be provided.

Third Embodiment

Figure 9:
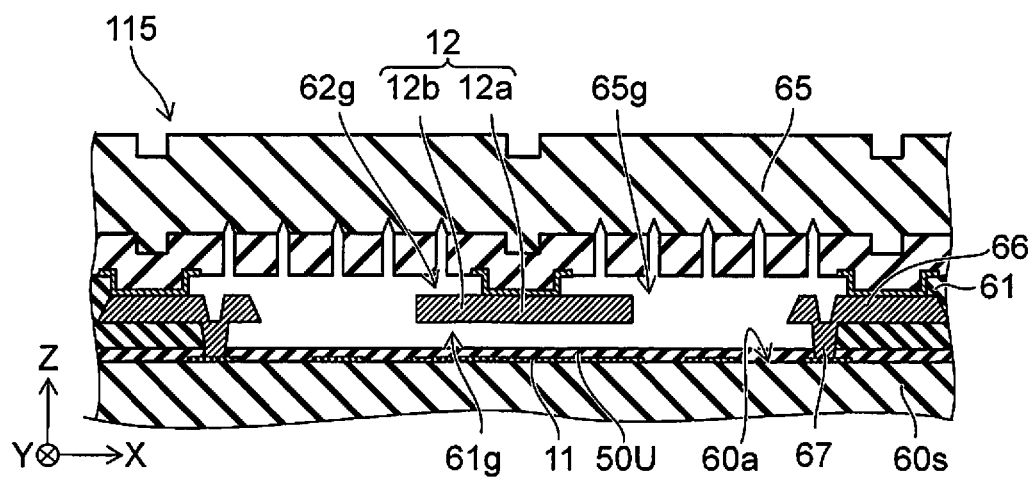
FIG. 9 is a schematic cross-sectional view illustrating a MEMS element according to a third embodiment.

FIG. 9 is a schematic cross-sectional view illustrating a MEMS element according to a third embodiment.

As shown in FIG. 9, the MEMS element 115 according to the embodiment also includes the base body 60s, the supporter 61, the film part 65, the first electrode 11, the second electrode 12, and the insulating member 50U. In the MEMS element 115, for example, the film part 65 is conductive. The film part 65 includes conductive silicon, etc. In the example, a connection part 66 is provided at the supporter 61. The connection part 66 electrically connects the film part 65 to a conductive part 67 provided at the base body 60s. For example, the second electrode 12 is electrically connected to the conductive part 67 via the film part 65 and the connection part 66. Otherwise, the configuration of the MEMS element 115 may be similar to the configurations of any of the MEMS elements 110 to 114.

In the MEMS element 115, for example, an electrical characteristic between the first electrode 11 and the conductive part 67 can be detected. An electrical characteristic (e.g., the electrostatic capacitance) the first electrode 11 and between the second electrode 12 can be detected thereby. In the third embodiment as well, a MEMS element that has stable characteristics can be provided.

In the embodiments recited above, the MEMS element includes, for example, a sensor. The MEMS element may include, for example, an actuator, etc.

The embodiments may include the following configurations (e.g., technological proposals).
Configuration 1
 A MEMS element, comprising:
 a base body;
 a supporter fixed to the base body;
 a film part separated from the base body in a first direction and supported by the supporter;
 a first electrode fixed to the base body and provided between the base body and the film part;
 a second electrode fixed to the film part and provided between the first electrode and the film part; and
 an insulating member, the insulating member including a first insulating region and a second insulating region, the first insulating region being provided between the first electrode and the second electrode, a first gap being provided between the first insulating region and the second electrode, the second insulating region not overlapping the first electrode in the first direction,
 a first thickness along the first direction of the first insulating region being thinner than a second thickness along the first direction of the second insulating region.

Configuration 2

The MEMS element according to Configuration 1, wherein a sum of the first thickness and a third thickness is not less than 0.8 times and not more than 1.2 times the second thickness, the third thickness being of the first electrode along the first direction.

Configuration 3

The MEMS element according to Configuration 1, wherein the second thickness is thicker than a third thickness, the third thickness being of the first electrode along the first direction.

Configuration 4

The MEMS element according to Configuration 1 or 2, wherein the first insulating region includes a first insulating film and a second insulating film, the first insulating film is between the first electrode and the second insulating film, the second insulating region includes a third insulating film, a fourth insulating film, and a fifth insulating film, the third insulating film is between the base body and the fourth insulating film, and the fifth insulating film is between the third insulating film and the fourth insulating film.

Configuration 5

The MEMS element according to Configuration 4, wherein the insulating member further includes a third insulating region, and a direction from the third insulating region toward the first electrode is along a second direction crossing the first direction.

Configuration 6

The MEMS element according to Configuration 5, wherein the third insulating region is continuous with the first insulating film, and the insulating member includes a boundary between the third insulating region and the third insulating film.

Configuration 7

The MEMS element according to Configuration 5 or 6, wherein a direction from the third insulating film toward a portion of the third insulating region is along the second direction.

Configuration 8

The MEMS element according to any one of Configurations 4 to 7, wherein a material of the first insulating film and the third insulating film is different from a material of the fifth insulating film.

Configuration 9

The MEMS element according to Configuration 8, wherein a material of the second insulating film and the fourth insulating film is different from the material of the fifth insulating film.

Configuration 10

The MEMS element according to any one of Configurations 4 to 7, wherein the first insulating film and the third insulating film include silicon and nitrogen, and the fifth insulating film includes silicon and oxygen.

Configuration 11

The MEMS element according to Configuration 10, wherein the second insulating film and the fourth insulating film include at least one selected from the group consisting of a compound and silicon, and the compound includes silicon and at least one of nitrogen or oxygen.

Configuration 12

The MEMS element according to any one of Configurations 4 to 11, wherein a thickness of the first insulating film along the first direction is thinner than a third thickness of the first electrode along the first direction.

Configuration 13

The MEMS element according to any one of Configurations 4 to 11, wherein a thickness of the first insulating film along the first direction is not more than ¾ of a third thickness of the first electrode along the first direction.

Configuration 14

The MEMS element according to any one of Configurations 4 to 13, wherein a thickness along the first direction of the first insulating film is thinner than a thickness along the first direction of the third insulating film.

Configuration 15

The MEMS element according to any one of Configurations 1 to 14, wherein a portion of the second electrode does not overlap the first electrode in the first direction.

Configuration 16

The MEMS element according to any one of Configurations 1 to 14, wherein a portion of the first electrode does not overlap the second electrode in the first direction.

Configuration 17

The MEMS element according to any one of Configurations 1 to 14, wherein the first electrode is provided between the first insulating region and a first surface of the base body, the first electrode has a side surface along a direction crossing the first surface, and an angle between the side surface and the first surface is not less than 60 degrees but less than 90 degrees.

Configuration 18

The MEMS element according to any one of Configurations 1 to 17, wherein the second electrode includes a first portion and a second portion, the first portion is fixed to the film part, and a second gap is provided between the second portion and the film part in the first direction.

Configuration 19

The MEMS element according to any one of Configurations 1 to 18, wherein a distance between the first electrode and the second electrode changes according to a deformation of the film part.

Configuration 20

The MEMS element according to any one of Configurations 1 to 18, wherein an electrostatic capacitance between the first electrode and the second electrode changes according to a deformation of the film part.

According to the embodiments, a MEMS element that has stable characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in MEMS elements such as base bodies, supporters, film parts, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all MEMS sensors practicable by an appropriate design modification by one skilled in the art based on the MEMS sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A MEMS element, comprising:
   a base body;
   a supporter fixed to the base body;
   a film part separated from the base body in a first direction and supported by the supporter;
   a first electrode fixed to the base body and provided between the base body and the film part;
   a second electrode fixed to the film part and provided between the first electrode and the film part; and
   an insulating member, the insulating member including a first insulating region and a second insulating region, the first insulating region being provided between the first electrode and the second electrode, a first gap being provided between the first insulating region and the second electrode, the second insulating region not overlapping the first electrode in the first direction,
   a first thickness along the first direction of the first insulating region being thinner than a second thickness along the first direction of the second insulating region.

2. The element according to claim 1, wherein a sum of the first thickness and a third thickness is not less than 0.8 times and not more than 1.2 times the second thickness, the third thickness being of the first electrode along the first direction.

3. The element according to claim 1, wherein the second thickness is thicker than a third thickness, the third thickness being of the first electrode along the first direction.

4. The element according to claim 1, wherein
   the first insulating region includes a first insulating film and a second insulating film,
   the first insulating film is between the first electrode and the second insulating film,
   the second insulating region includes a third insulating film, a fourth insulating film, and a fifth insulating film,
   the third insulating film is between the base body and the fourth insulating film, and
   the fifth insulating film is between the third insulating film and the fourth insulating film.

5. The element according to claim 4, wherein
   the insulating member further includes a third insulating region, and
   a direction from the third insulating region toward the first electrode is along a second direction crossing the first direction.

6. The element according to claim 5, wherein
   the third insulating region is continuous with the first insulating film, and
   the insulating member includes a boundary between the third insulating region and the third insulating film.

7. The element according to claim 5, wherein a direction from the third insulating film toward a portion of the third insulating region is along the second direction.

8. The element according to claim 4, wherein a material of the first insulating film and the third insulating film is different from a material of the fifth insulating film.

9. The element according to claim 8, wherein a material of the second insulating film and the fourth insulating film is different from the material of the fifth insulating film.

10. The element according to claim 4, wherein
    the first insulating film and the third insulating film include silicon and nitrogen, and
    the fifth insulating film includes silicon and oxygen.

11. The element according to claim 10, wherein
    the second insulating film and the fourth insulating film include at least one selected from the group consisting of a compound and silicon, and
    the compound includes silicon and at least one of nitrogen or oxygen.

12. The element according to claim 4, wherein a thickness of the first insulating film along the first direction is thinner than a third thickness of the first electrode along the first direction.

13. The element according to claim 4, wherein a thickness of the first insulating film along the first direction is not more than ¾ of a third thickness of the first electrode along the first direction.

14. The element according to claim 4, wherein a thickness along the first direction of the first insulating film is thinner than a thickness along the first direction of the third insulating film.

15. The element according to claim 1, wherein a portion of the second electrode does not overlap the first electrode in the first direction.

16. The element according to claim 1, wherein a portion of the first electrode does not overlap the second electrode in the first direction.

17. The element according to claim 1, wherein
    the first electrode is provided between the first insulating region and a first surface of the base body,
    the first electrode has a side surface along a direction crossing the first surface, and
    an angle between the side surface and the first surface is not less than 60 degrees but less than 90 degrees.

18. The element according to claim 1, wherein
    the second electrode includes a first portion and a second portion,
    the first portion is fixed to the film part, and
    a second gap is provided between the second portion and the film part in the first direction.

19. The element according to claim 1, wherein a distance between the first electrode and the second electrode changes according to a deformation of the film part.

20. The element according to claim 1, wherein an electrostatic capacitance between the first electrode and the second electrode changes according to a deformation of the film part.

* * * * *